(12) United States Patent
Anze

(10) Patent No.: US 9,581,893 B2
(45) Date of Patent: Feb. 28, 2017

(54) MASK MANUFACTURING METHOD, MASK SUBSTRATE, AND CHARGED BEAM DRAWING METHOD

(71) Applicant: NUFLARE TECHNOLOGY, INC., Yokohama (JP)

(72) Inventor: Hirohito Anze, Kamakura (JP)

(73) Assignee: NUFLARE TECHNOLOGY, INC., Yokohama (JP)

( * ) Notice: Subject to any disclaimer, the term of this patent is extended or adjusted under 35 U.S.C. 154(b) by 167 days.

(21) Appl. No.: 14/566,585

(22) Filed: Dec. 10, 2014

(65) Prior Publication Data

US 2015/0241767 A1 Aug. 27, 2015

(30) Foreign Application Priority Data

Feb. 24, 2014 (JP) .................. 2014-033232

(51) Int. Cl.

| | |
|---|---|
| *G03F 1/42* | (2012.01) |
| *G03F 1/50* | (2012.01) |
| *G03F 1/54* | (2012.01) |
| *G03F 1/78* | (2012.01) |
| *G03F 1/26* | (2012.01) |
| *H01J 37/317* | (2006.01) |
| *G03F 9/00* | (2006.01) |

(52) U.S. Cl.
CPC .................. *G03F 1/42* (2013.01); *G03F 1/26* (2013.01); *G03F 1/50* (2013.01); *G03F 1/54* (2013.01); *G03F 1/78* (2013.01); *G03F 9/7053* (2013.01); *H01J 37/3174* (2013.01); *H01J 2237/2448* (2013.01); *H01J 2237/31793* (2013.01)

(58) Field of Classification Search
CPC ..... G03F 1/26; G03F 1/42; G03F 1/50; G03F 1/54; G03F 1/78; G03F 9/7053; H01J 37/3174; H01J 2237/2448; H01J 2237/31793
USPC ....................................... 430/5, 22, 296, 942
See application file for complete search history.

(56) References Cited

FOREIGN PATENT DOCUMENTS

JP  2000-150358 A  5/2000

*Primary Examiner* — Christopher Young
(74) *Attorney, Agent, or Firm* — Patterson & Sheridan, LLP.

(57) ABSTRACT

A manufacturing method of a phase shift mask in an embodiment includes: forming a metal layer on a substrate, the metal layer having a first region and a second region, the first region being configured to emit secondary electrons by irradiation with electrons, the second region being configured to emit secondary electrons higher in density than the first region, by the irradiation with electrons; patterning the metal layer to form a main pattern in the first region and an alignment mark in the second region; forming a resist layer on the patterned metal layer; and aligning the substrate using a secondary electron image of the alignment mark.

20 Claims, 13 Drawing Sheets

MASK MANUFACTURING METHOD, MASK SUBSTRATE, AND CHARGED BEAM DRAWING METHOD

CROSS REFERENCE TO RELATED APPLICATION

This application is based upon and claims the benefit of priority from Japanese Patent Application No. 2014-033232, filed on Feb. 24, 2014; the entire contents of which are incorporated herein by reference.

FIELD

Embodiments described herein generally relate to a mask manufacturing method, a mask substrate, and a charged beam drawing method.

BACKGROUND

To respond to miniaturization of a semiconductor device such as an LSI, optical lithography by a phase sift mask (PSM) is used. The PSM uses interference of light to enable exposure with resolution higher than that defined by wavelength of light.

Here, in a Levenson phase shift mask, for example, a pattern is created in a light shielding film formed on a light transmissive mask substrate as a first layer, and then a pattern for a shifter on the mask substrate as a second layer. Therefore, before drawing of the pattern of the second layer, alignment with the pattern of the first layer is performed. For the alignment, a secondary electron image of the pattern (alignment mark) of the first layer is used.

However, in recent years, the light shielding film significantly becomes thinner and therefore detection of the alignment mark becomes more difficult, so that it becomes more difficult to secure the accuracy of overlapping the patterns of the first layer and the second layer.

Note that a technology for obtaining a sufficient detection signal of the alignment mark is disclosed.

DETAILED DESCRIPTION

A mask manufacturing method in an embodiment includes: forming a metal layer on a substrate, the metal layer having a first region and a second region, the first region being configured to emit secondary electrons by irradiation with electrons, the second region being configured to emit secondary electrons higher in density than the first region, by the irradiation with electrons; patterning the metal layer to form a main pattern in the first region and an alignment mark in the second region; forming a resist layer on the patterned metal layer; and aligning the substrate using a secondary electron image of the alignment mark.

Hereinafter, an embodiment will be described in detail with reference to the drawings.

Figure 1A:
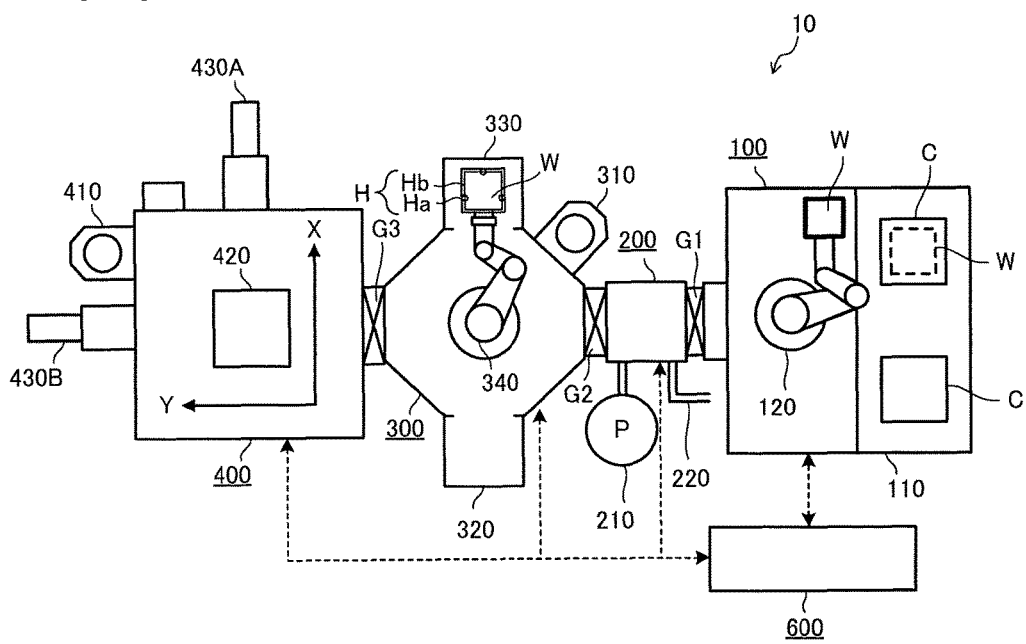
FIG. 1A and FIG. 1B are schematic views of a mask drawing apparatus.
Figure 1B:
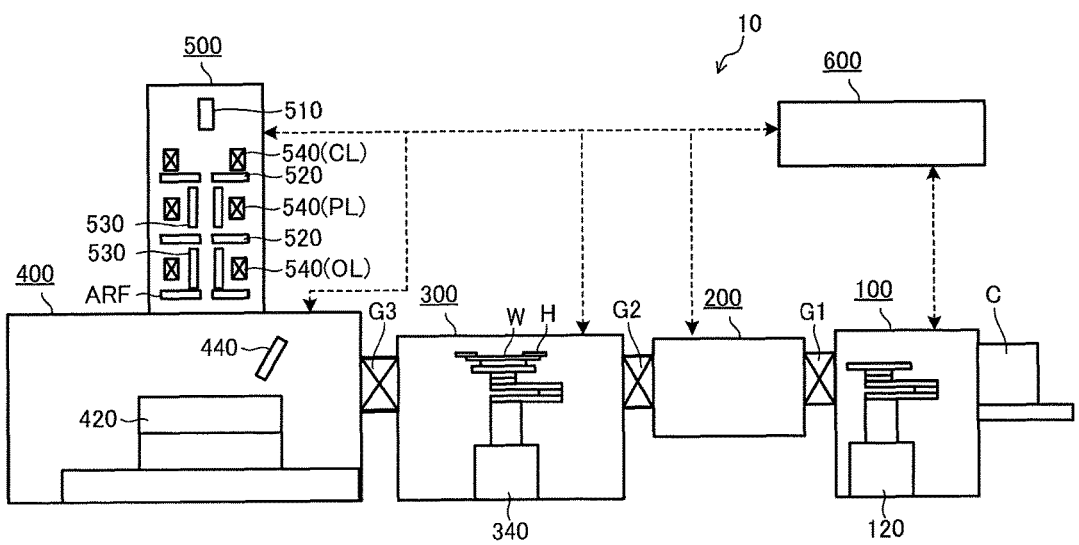

FIG. 1A and FIG. 1B are schematic views of a mask drawing apparatus 10. FIG. 1A is a plan view of the mask drawing apparatus 10. FIG. 1B is a cross-sectional view of the mask drawing apparatus 10. Hereinafter, a configuration of the mask drawing apparatus 10 will be described with reference to FIG. 1A and FIG. 1B. Note that in FIG. 1A, illustration of an electron beam optical column 500 is omitted.

As illustrated in FIG. 1A and FIG. 1B, the mask drawing apparatus 10 includes a load/unload interface (I/F) 100, an input/output (I/O) chamber 200, a robot chamber (R chamber) 300, a writing chamber (W chamber) 400, the electron beam optical column 500, a control system unit 600, and gate valves G1 to G3.

The load/unload I/F 100 includes a mounting table 110 on which a container C (for example, SMIF Pod) housing a mask substrate W to be used in this embodiment is mounted, and a carrier robot 120 that carries the mask substrate W.

The mask substrate W is a substrate in which a light shielding film (for example, a later-described metal layer 40) and a resist film (for example, a later-described resist layer 50, 55) are stacked. The light shielding film has a main pattern MP and alignment marks AM.

Here, when irradiation with electrons is performed under the same condition, the density of emitted secondary electrons is different between the vicinity of the alignment mark AM and the vicinity of the main pattern MP. More specifically, the density of secondary electrons emitted from the vicinity of the alignment mark AM is larger than the density of secondary electrons emitted from the vicinity of the main pattern MP. The main pattern MP and the alignment mark AM are different in characteristics (for example, film thickness, material) of the light shielding film and thus different in the density of the emitted secondary electrons. As a result of this, even when the light shielding film at the main pattern MP is thin, detection of the alignment mark AM is easy. Note that its details will be described later.

The I/O chamber 200 is a load lock chamber for carrying in/out the mask substrate W while keeping the inside of the R chamber 300 under vacuum (low pressure). The I/O chamber 200 is provided with the gate valve G1 between the load/unload I/F 100 and the I/O chamber 200 and includes a vacuum pump 210 and a gas supply system 220. The vacuum pump 210 is, for example, a dry pump, a turbo molecular pump, or the like, which evacuates the inside of the I/O chamber 200. The gas supply system 220 supplies vent gas (for example, nitrogen gas or CDA) to the inside of the I/O chamber 200 when setting a pressure of the I/O chamber 200 to an atmospheric pressure.

When evacuating the inside of the I/O chamber 200, the vacuum pump 210 connected to the I/O chamber 200 is used for evacuation. Further, when returning the inside of the I/O chamber 200 to the atmospheric pressure, the vent gas is supplied from the gas supply system 220 to set the inside of the I/O chamber 200 to the atmospheric pressure. Note that when evacuating the inside of the I/O chamber 200 and when setting the inside of the I/O chamber 200 to the atmospheric pressure, the gate valves G1, G2 are closed (Close).

The R chamber 300 has a vacuum pump 310, an alignment chamber 320, a grounding body housing chamber 330, and a carrier robot 340. The R chamber 300 is connected to the I/O chamber 200 via the gate valve G2.

The vacuum pump 310 is, for example, a Cryo pump, a turbo molecular pump, or the like. The vacuum pump 310 is connected to the R chamber 300 and evacuates the inside of the R chamber 300 to keep it under high vacuum. The alignment chamber 320 is a chamber to position (align) the mask substrate W. The grounding body housing chamber 330 is a chamber that houses a grounding body H. Note that the alignment is not premised on the irradiation with an electron beam unlike later-described alignment in the W chamber 400.

The grounding body H includes a plurality of (for example, three) grounding pins Ha and a frame body Hb in a picture frame shape. In the state that the grounding body H is set on the mask substrate W, drawing with an electron beam is performed on the mask substrate W. In this event, the grounding body H is connected to a not-illustrated ground. In short, the grounding body H prevents accumulation (charge) of electric charges in the mask substrate W due to the irradiation with the electron beam. The carrier robot 340 carries the mask substrate W between the I/O chamber 200, the alignment chamber 320, the grounding body housing chamber 330, and the W chamber 400.

The W chamber 400 includes a vacuum pump 410, an X-Y stage 420, drive mechanisms 430A, 430B, and a secondary electron detector 440, and is connected to the R chamber 300 via the gate valve G3.

The vacuum pump 410 is, for example, a Cryo pump, a turbo molecular pump, or the like. The vacuum pump 410 is connected to the W chamber 400 and evacuates the inside of the W chamber 400 to keep it under high vacuum. The X-Y stage 420 is a platform for mounting the mask substrate W thereon. The drive mechanism 430A drives the X-Y stage 420 in an X-direction. The drive mechanism 430B drives the X-Y stage 420 in a Y-direction. The secondary electron detector 440 detects the secondary electrons emitted from the light shielding film (particularly from the alignment mark AM) of the mask substrate W, and outputs a secondary electron signal.

The electron beam optical column 500 includes an electron gun 510, apertures 520, deflector 530, lenses 540 (illumination lens (CL), projection lens (PL), objective lens (OL)), an anti-reflection film ARF and so on, and irradiates the mask substrate W mounted on the X-Y stage 420 with an electron beam.

The control system unit 600 is, for example, a computer or the like, and controls the mask drawing apparatus 10. The control system unit 600 controls the electron beam optical column 500 and the X-Y stage 420 in conjunction with each other to thereby draw a desired pattern on the mask substrate W with the electron beam.

The control system unit 600 further causes the electron beam optical column 500 to apply the electron beam, and detects the secondary electron signal from the secondary electron detector 440 while scanning the electron beam. As a result of this, it becomes possible to detect an image (secondary electron image) of the alignment mark AM of the mask substrate W and align the mask substrate W. In other words, it becomes possible to correct position/rotation of the mask substrate W and correct distortion of the main pattern MP.

First Embodiment

Hereinafter, a first embodiment will be described. Hereinafter, processing of creation, drawing and so on of the mask substrate W will be described taking a Levenson phase shift mask as an example. However, the Levenson phase shift mask is merely one example and other masks can be created.

A. Phase Shift Mask

Hereinafter, the phase shift mask according to this embodiment will be described.

Figure 2:
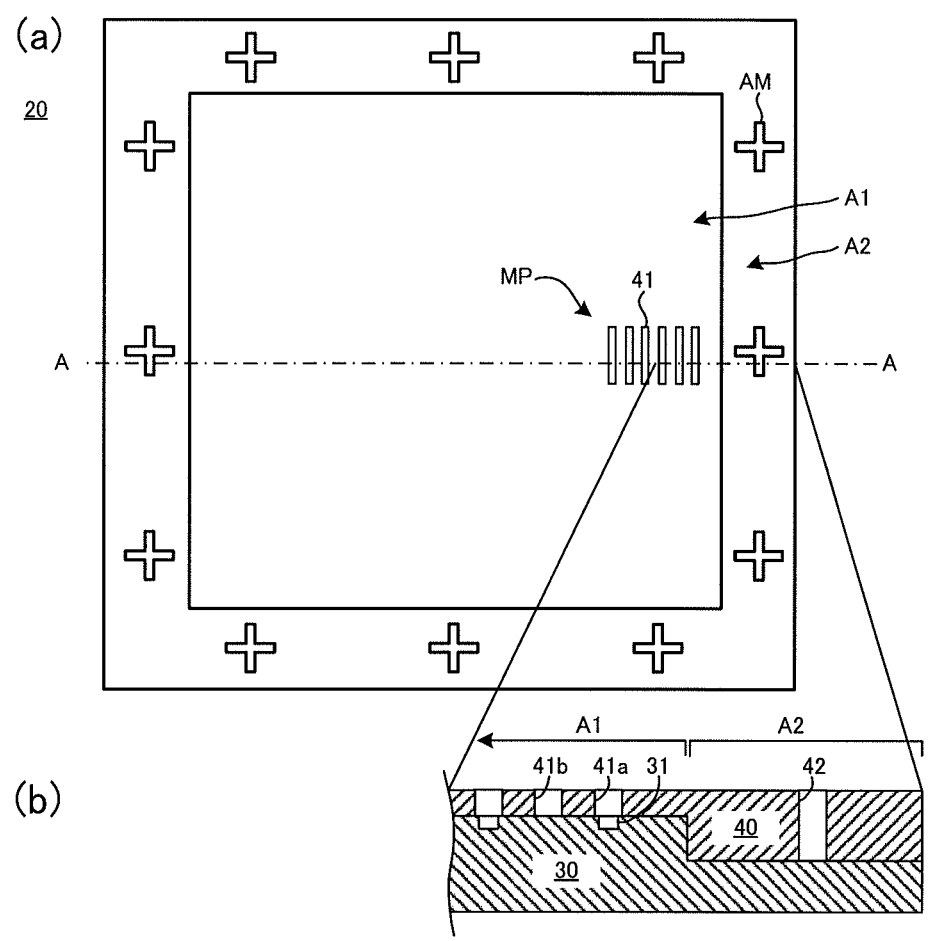
FIG. 2 is a plan view and a cross-sectional view of a phase shift mask 20 according to a first embodiment.

FIG. 2 is a top view and a partial cross-sectional view illustrating a phase shift mask 20 according to the first embodiment. (a) and (b) in FIG. 2 correspond to the top view and the cross-sectional view respectively. The cross-sectional view illustrates an enlarged state of the phase shift mask 20 cut along a line A-A in the top view.

The phase shift mask 20 is a mask for exposing a resist or the like to be used for creating a semiconductor device such as an LSI or the like by photolithography. Here, a so-called Levenson phase shift mask is illustrated in which both of a light transmissive substrate 30 and the metal layer 40 being the light shielding film are patterned. Here, the phase shift mask 20 has the substrate 30 and the metal layer 40.

For the constituent material of the substrate 30, an optical material (for example, quartz glass) excellent in transmission characteristic (light transmitting property) of light (for example, ultraviolet) is used.

For the constituent material of the metal layer 40, a metal material (for example, Cr, Ta, MoSi or Al) having a light shielding property and a secondary-emission characteristic is used. Note that, though not illustrated, the uppermost layer of the metal layer 40 is typically oxidized for antireflection. For example, a thin layer of chromium oxide is arranged on the metal layer of chromium (Cr).

A main surface of the substrate 30 is divided into a main pattern region A1 and an alignment mark region A2.

In the main pattern region A1, the main pattern MP to be projected on a semiconductor wafer for creating a semiconductor device is arranged. Here, a plurality of openings 41 are formed in the metal layer 40 as a part of the main pattern MP. During exposure, light passes through the openings 41 and the substrate 30. Namely, the openings 41 (41a, 41b) are light transmitting parts through which light passes.

The substrate 30 is etched and is thus smaller in thickness at a part (opening 41a) of the plurality of openings 41. In the opening 41a, as compared to the opening 41b where the substrate 30 is not etched, a phase difference corresponding to the difference in thickness of the substrate 30 occurs. In short, the opening 41a of the openings 41 is a phase shifter light transmitting part bringing about the phase difference.

Note that not the substrate 30 itself is etched but a light transmitting material layer arranged between the substrate 30 and the metal layer 40 may be etched. By patterning the layer of the light transmitting material layer, the phase shifter light transmitting part can be formed.

Appropriately arranging a light shielding part (portion having no opening), the light transmitting part, and the phase shifter light transmitting part within the main pattern region A1 in the phase shift mask 20 enables highly accurate pattern exposure utilizing interference of light.

The alignment mark region A2 is a region where the alignment marks AM for aligning the mask substrate W are arranged at the time of creating the phase shift mask 20. The alignment mark AM here is composed of an opening 42 in the metal layer 40 having a cross shape. By irradiating the alignment mark region A2 with the electron beam and detecting the secondary electron image in the vicinity of the alignment mark AM as described later, it becomes possible to check the position and so on of the mask substrate W in the mask drawing apparatus 10 and perform highly accurate drawing.

In this embodiment, the thickness of the metal layer 40 in the alignment mark region A2 is larger than that in the main pattern region A1. As a result of this, it is possible to secure the quantity (density) of the secondary electrons when the alignment mark region A2 is irradiated with electrons and to obtain a clear secondary electron image. Even when the thickness of the metal layer 40 in the main pattern region A1 is small and the quantity (density) of the secondary electrons when the main pattern region A1 is irradiated with electrons is low and therefore it is difficult to obtain a clear secondary electron image, it is easy to obtain a clear secondary electron image in the alignment mark region A2.

In this embodiment, the thickness of the substrate 30 is made different, in addition to the thickness of the metal layer 40, between the main pattern region A1 and the alignment mark region A2. The thickness of the metal layer 40 is set to, for example, 5 nm to 20 nm in the main pattern region A1 and to 40 nm to 70 nm in the alignment mark region A2.

As a result, the heights of upper surfaces of the metal layers 40 are almost equal in the main pattern region A1 and the alignment mark region A2. The reason why the heights of the main surfaces (upper surfaces) of the metal layers 40 are fixed is to secure stability of the position of the phase shift mask 20 when the phase shift mask 20 is placed on the exposure apparatus for photolithography. The main surfaces of the metal layers 40 are placed on a holding part of the exposure apparatus in this event, so that unless the heights of the main surfaces of the metal layers 40 are uniform, the phase shift mask 20 cannot be stably placed because of tilting, thus deteriorating the exposure accuracy.

Note that it is preferable to differ the compositions of the metal layers 40 between the main pattern region A1 and the alignment mark region A2 in terms of manufacturing steps of the phase shift mask 20 as described later.

B. Manufacture of Phase Shift Mask 20

Hereinafter, a manufacturing method of the phase shift mask 20 will be described. According to the following procedures (1) to (4), the phase shift mask 20 can be manufactured.

(1) Preparation of Mask Substrate W1

Figure 3A:
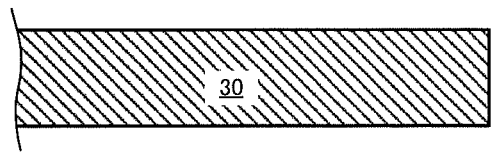
FIG. 3A and FIG. 3B are views illustrating manufacturing steps of the phase shift mask 20 according to the first embodiment.

A mask substrate W1 in which the metal layers 40 and a resist layer 50 are formed on the substrate 30 is created. The mask substrate W1 can be created by the following procedures a to d.

a. Etching of the substrate 30 (see FIG. 3A, FIG. 3B)

Figure 3B:
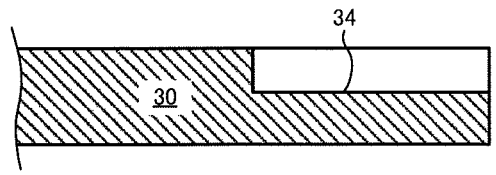

The substrate 30 is prepared (see FIG. 3A), and a recessed portion 34 is formed in the alignment mark region A2 (see FIG. 3B). The recessed portion 34 is provided in the alignment mark region A2 and is for uniforming the heights of the metal layers 40 in the main pattern region A1 and the alignment mark region A2.

For the formation of the recessed portion 34, etching or mechanical polishing can be utilized.

<In the Case of Etching>

For example, a resist layer having an opening corresponding to the recessed portion 34 is created in the substrate 30, and the substrate 30 is etched using the resist layer as a mask. For this etching, for example, dry etching such as reactive ion etching (RIE) or the like can be used. Note that the resist layer is removed with a solvent or the like after the etching.

<In the Case of Mechanical Polishing>

Figure 4A:
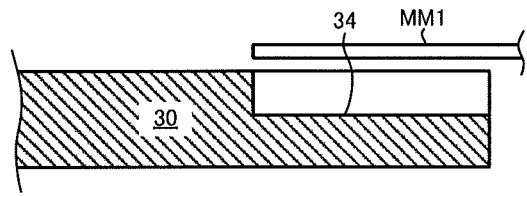
FIG. 4A to FIG. 4E are views illustrating manufacturing steps of the phase shift mask 20 according to the first embodiment.
Figure 4B:
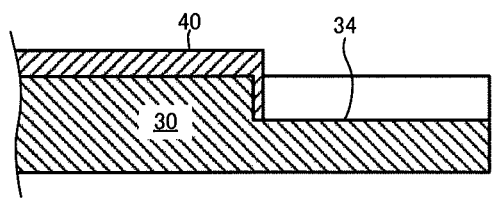

The recessed portion 34 may be formed by mechanically polishing the alignment mark region A2 of the substrate 30. In this case, the mask of resist or the like is not always necessary.

b. Formation of the metal layer 40 in the main pattern region A1 (see FIG. 4A, FIG. 4B)

The metal layers 40 are formed in the main pattern region A1 and the alignment mark region A2.

Figure 4C:
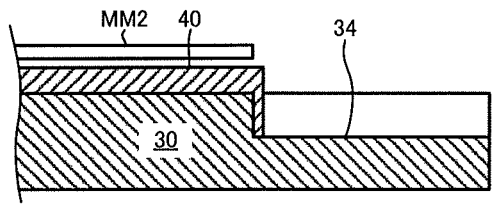
Figure 4D:
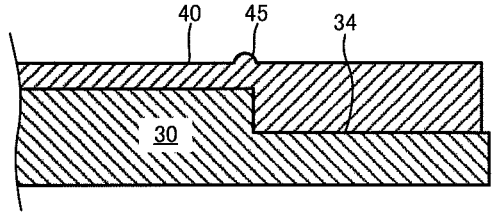

A mask MM1 is placed in the alignment mark region A2 and the metal layer 40 is formed by sputtering or the like. For the mask MM1, for example, a mechanical mask of a metal plate or the like can be used.

c. Formation of the metal layer 40 in the alignment mark region A2 (see FIG. 4C, FIG. 4D)

Figure 4E:
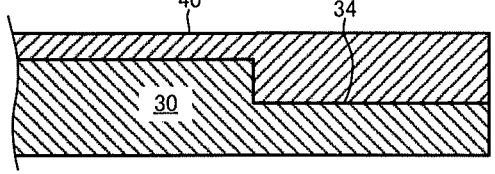

A mask MM2 is placed in the main pattern region A1 and the metal layer 40 is formed by the sputtering or the like. For the mask MM2, for example, a mechanical mask of a metal plate or the like can be used. Here, the metal layers 40 are formed to overlap each other near the boundary between the main pattern region A1 and the alignment mark region A2 to cause a projecting portion 45.

d. Planarization of the metal layers 40 (see FIG. 4D, FIG. 4E)

The surfaces of the metal layers 40 are planarized using the chemical mechanical polishing or the like as necessary. Here, the aforementioned projecting portion 45 is removed by planarization.

e. Formation of the resist layer 50 (see FIG. 5A)

Figure 5A:
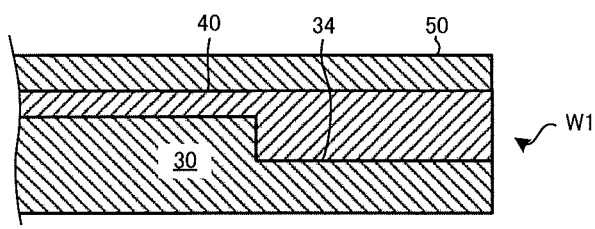
FIG. 5A to FIG. 5D are views illustrating manufacturing steps of the phase shift mask 20 according to the first embodiment.
Figure 5B:
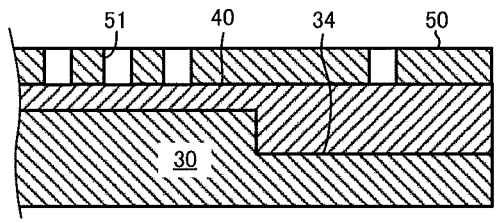
Figure 5C:
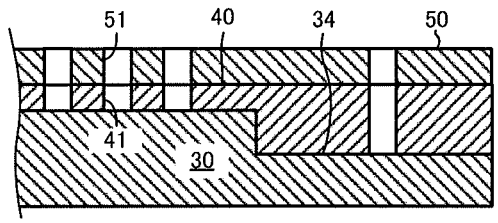
Figure 5D:
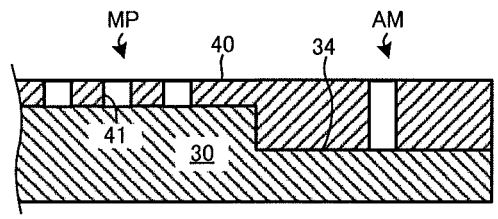

Thereafter, the resist layer 50 is formed on the metal layers 40, whereby the mask substrate W1 is created (see FIG. 5A).

Here, the metal layers 40 are formed in the main pattern region A1 and the alignment mark region A2 in this order, but this order may be inverted.

Further, the metal layers 40 are formed to overlap each other at the boundary between the main pattern region A1 and the alignment mark region A2, but the metal layers 40 may be thin or no metal layers 40 may be provided at the boundary.

Here, it is preferable to change the materials of the main pattern region A1 and the alignment mark region A2 to make the etching rate of the metal layer 40 in the alignment mark region A2 higher than that in the main pattern region A1. More specifically, the metal layer 40 in the main pattern region A1 (first region) is etched at a first rate, while the metal layer 40 in the alignment mark region A2 (second region) is etched at a second rate higher than the first rate.

This is for improving the accuracy of patterning of the metal layers 40. It is assumed that the etching rates in the main pattern region A1 and the alignment mark region A2 are the same. In this case, whereas the etching in the main pattern region A1 has been actually completed, the etching in the alignment mark region A2 has not been completed, and the etching needs to be continued. In this case, the etching is excessively performed in the main pattern region A1, resulting in a decrease in accuracy of the patterning in the main pattern region A1.

Ideally, it is preferable that the etching is completed at the same time in the main pattern region A1 and the alignment mark region A2. It is assumed here that the film thickness of the metal layer 40 in the main pattern region A1 is D1 and the film thickness of the metal layer 40 in the alignment mark region A2 is D2. It is ideal that the etching rates in the main pattern region A1 and the alignment mark region A2 are proportional to the respective film thicknesses D1, D2. However, an error of a certain degree, for example, about 5 to 10% as compared with that in the ideal case is allowable.

The change of the materials of the main pattern region A1 and the alignment mark region A2 becomes possible by making film formation conditions (for example, sputtering conditions) differ from each other. For example, as the gas during the sputtering, an $Ar/O_2$ mixed gas is used for forming the main pattern region A1 and a pure Ar gas is used for forming the alignment mark region A2. This forms the metal layer 40 in the state that chromium (Cr) and chromium oxide ($CrO_2$) are mixed together in the main pattern region A1, and forms the metal layer 40 of chromium (Cr) in the alignment mark region A2. In short, the metal layer 40 in the main pattern region A1 (first region) contains an oxide, and the metal layer 40 in the alignment mark region A2 (second region) is substantially free of oxide. As described above, changing the film formation conditions makes it possible to change the materials of the metal layers 40 in the main pattern region A1 and the alignment mark region A2 from each other and thereby make the etching rates of the metal layers 40 differ from each other.

(2) Patterning of the metal layers 40 (see FIG. 5A to FIG. 5D)

The metal layers 40 are patterned to form the main pattern MP and the alignment mark AM in the main pattern region A1 and the alignment mark region A2 respectively. The patterning of the metal layers 40 can be performed in the following procedures a to c.

a. The mask substrate W1 (see FIG. 5A) is carried into the W chamber 400 of the mask drawing apparatus 10, and the mask substrate W1 is irradiated with the electron beam.

b. Thereafter, the mask substrate W1 is taken out of the mask drawing apparatus 10 and developed, whereby the resist layer 50 is patterned (see FIG. 5B).

Different etching rates in the main pattern region A1 and the alignment mark region A2 as has been described enable creation of the main pattern MP with high accuracy.

c. The metal layers 40 are patterned by being subjected, for example, to dry etching using the patterned resist layer 50 as a mask (see FIG. 5C), and the resist layer 50 is removed with a solvent or the like (see FIG. 5D).

Figure 6A:
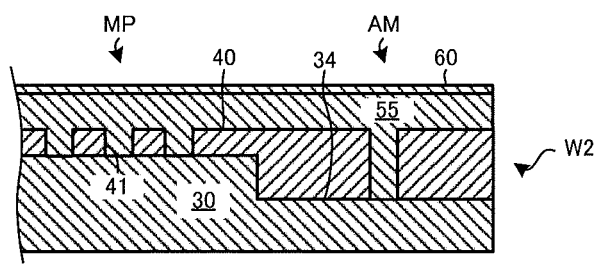
FIG. 6A to FIG. 6D are views illustrating manufacturing steps of the phase shift mask 20 according to the first embodiment.

(3) Alignment and drawing (see FIG. 6A)

After the patterning of the metal layers 40 (first layer), patterning of the substrate 30 (second layer) is performed. Prior to the patterning, alignment of the substrate 30 needs to be performed to make the patterns of the first layer and the second layer correspond to each other. Exposures with electron beam of the first layer and the second layer are performed in the mask drawing apparatus 10, but the substrate 30 is taken out of the mask drawing apparatus 10 before and after the exposures, so that the mask substrate W1 is changed in position and so on and therefore needs to be adjusted.

Note that the exposures with electron beam of the first layer and the second layer may be performed in different mask drawing apparatuses 10.

This alignment and drawing can be performed in the following procedures a to d.

a. Formation of a mask substrate W2

Prior to the alignment, a resist layer 55 and a conductive layer 60 are formed on the substrate 30. As a result, the mask substrate W2 is formed.

Note that the conductive layer 60 is to prevent deterioration of positional accuracy by charging the opening portion of the substrate 30 which has been exposed by etching when the mask substrate W2 is irradiated with the electron beam, and is composed of, for example, a conductive material containing sulfonic acid as a main constituent.

b. Detection of the secondary electron image

The mask substrate W2 is carried into the W chamber 400 of the mask drawing apparatus 10 and irradiated with the electron beam, and an image of secondary electrons emitted from the vicinity of the alignment mark AM is detected. By detecting the secondary electrons while scanning the electron beam on the substrate 30, the image of secondary electrons in the vicinity of the alignment mark AM can be detected. Since the metal layer 40 does not exist at the alignment mark AM itself, the alignment mark is detected as a region from which no secondary electron is actually emitted. In this event, not the quantity of the secondary electrons itself but signal processing (for example, differential processing) performed thereon can make the boundary between the alignment mark AM itself (without the metal layer 40) and its surroundings (with the metal layer 40) clearer.

c. Alignment of the mask substrate W2

Detecting the alignment mark AM and its position makes it possible to correct distortion and position/rotation of the main pattern MP.

For example, when the internal stress of the metal layers 40 changes due to the etching, relative positional displacement in the pattern, namely, distortion of the pattern may occur. This distortion can be detected through a relative distance displacement between the alignment marks AM.

Further, the positional displacement and rotation of the mask substrate W2 and accordingly the main pattern MP can be detected through average an position of the alignment mark AM.

In this event, the metal layer 40 in the alignment mark AM is large, so that the secondary electron signal becomes large to make it easy to detect the alignment mark AM.

Note that the alignment here does not always mean the positional change or rotation of the mask substrate W2. Changing the reference position of irradiation with the electron beam stored in the control system unit 600 without performing positional change or rotation of the mask substrate W2 is allowed to be called alignment.

d. Drawing

The position and distortion of the main pattern MP is detected by the alignment mark AM, and drawing is performed to the resist layer 55 by applying the electron beam so as to correspond to the detected distortion, positional displacement, or rotation. Since the drawing is performed in the state that the alignment has been performed using the surely detected alignment mark AM, a phase shift mask 20 with high accuracy of overlapping the first layer and the second layer can be manufactured.

Figure 6B:
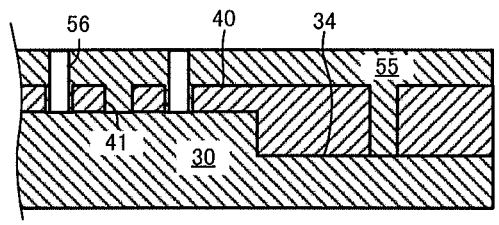
Figure 6C:
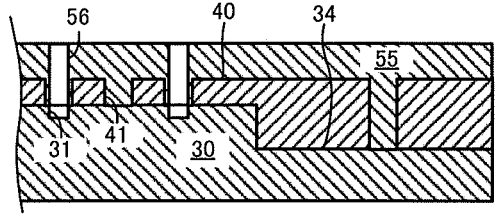
Figure 6D:
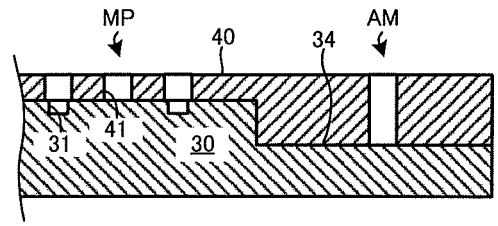
Figure 7A:
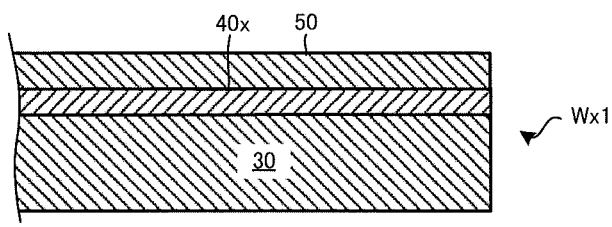
FIG. 7A to FIG. 7D are views illustrating manufacturing steps of a phase shift mask 20x according to a comparative example.
Figure 7B:
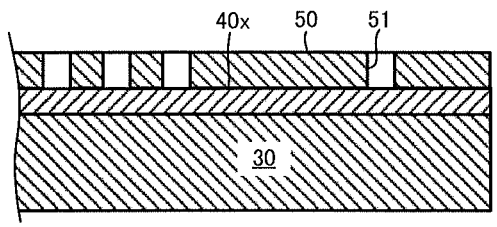
Figure 7C:
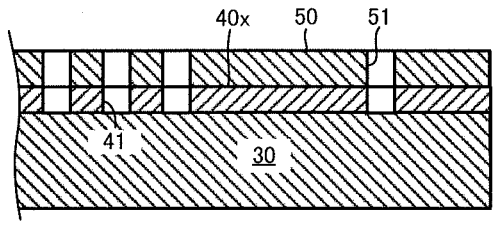
Figure 7D:
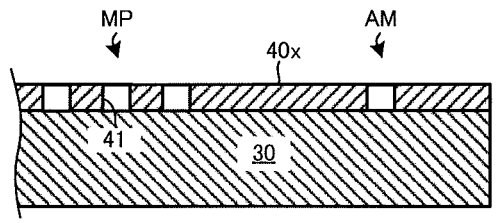

(4) Patterning of the substrate 30 (see FIG. 6B to FIG. 6D)

The substrate 30 is patterned. The patterning can be performed in the following procedures a, b.

a. Patterning of the resist layer 50

The mask substrate W2 is taken out of the mask drawing apparatus 10 and developed, whereby the resist layer 50 is patterned (see FIG. 6B)

b. Patterning of the substrate 30 (Development)

The substrate 30 is patterned by being subjected, for example, to dry etching using the patterned resist layer 55 as a mask (see FIG. 6C), and the resist layer 55 is removed with a solvent or the like (see FIG. 6D).

The phase shift mask 20 is created as described above.

COMPARATIVE EXAMPLE

A comparative example will be described. Also in the comparative example, a substrate 30 (mask substrate Wx1) on which a metal layer 40x and a resist layer 50 are arranged is used, patterning of the metal layer 40x, alignment, drawing, patterning of the substrate 30 are performed in sequence. Here, the material and the film thickness of the metal layer 40x are the same in a main pattern region A1 and an alignment mark region A2. A phase shift mask 20x can be manufactured by the following procedures (1) to (3).

Figure 8A:
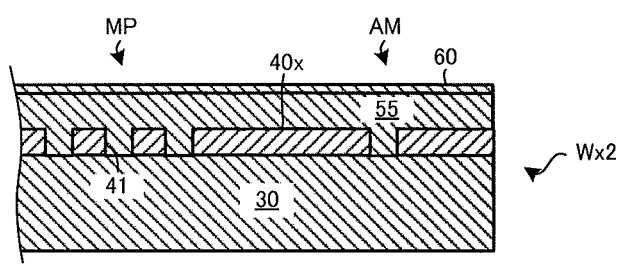
FIG. 8A to FIG. 8D are views illustrating manufacturing steps of the phase shift mask 20x according to the comparative example.
Figure 8B:
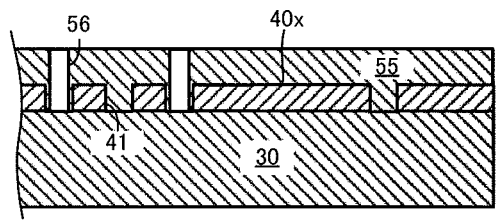
Figure 8C:
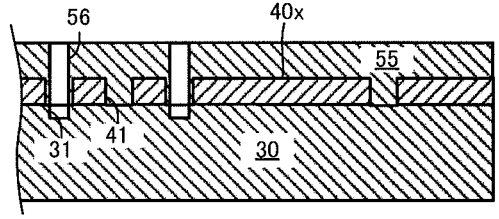
Figure 8D:
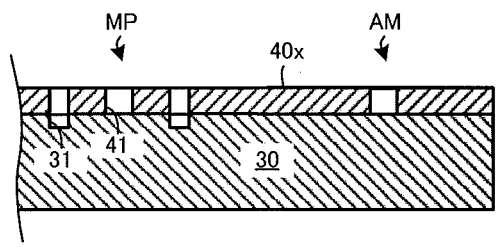

(1) Patterning of the metal layer 40x (FIG. 7A to FIG. 7D)
(2) Alignment and drawing (see FIG. 8A)
(3) Patterning of the substrate 30 (see FIG. 8B to FIG. 8D)

These procedures (1) to (3) are the same as the procedures (2) to (4) in the first embodiment respectively and therefore detailed description thereof will be omitted.

In the comparative example, since the material and the film thickness of the metal layer 40x are the same in the main pattern region A1 and the alignment mark region A2, a problem may occur in alignment.

Its background is progressive reduction in thickness of the metal layer 40x being the light shielding film. A taper is formed in a cross-section of the metal layer 40x during etching and affects the accuracy of the mask to be formed. Therefore, the metal layer 40x being the light shielding film becomes thinner with miniaturization of the pattern.

Figure 9A:
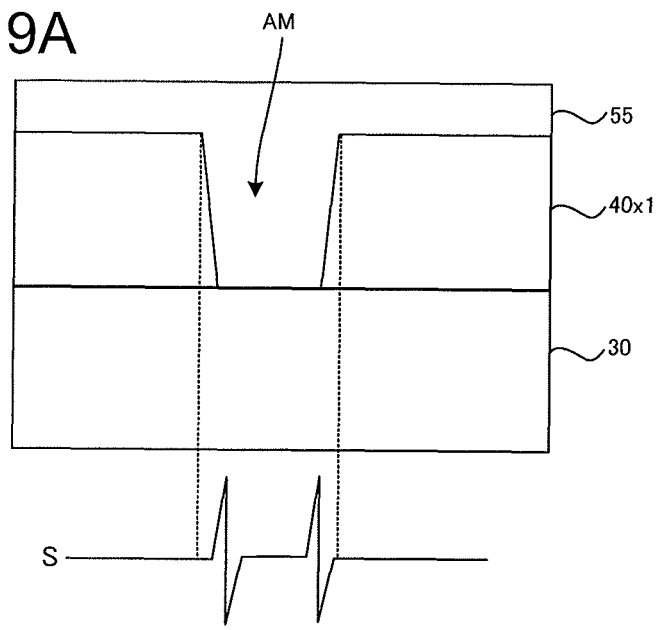
FIG. 9A and FIG. 9B are views illustrating an alignment step of mask substrates Wx2 according to the comparative example.
Figure 9B:
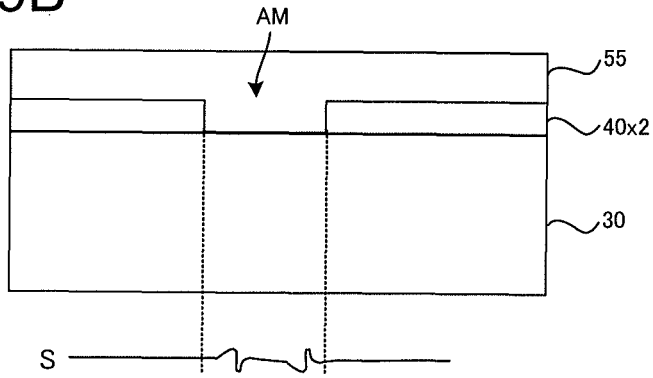

FIG. 9A and FIG. 9B are views illustrating states of the cross-sections at the time of alignment in mask substrates Wx2 using a thick metal layer 40x1 and a thin metal layer 40x2. The metal layers 40x1, 40x2 have thicknesses of, for example, about 50 nm and 10 nm or less respectively.

The signal of secondary electrons is large in the thick metal layer 40x1 as illustrated in FIG. 9A, and the edge (contour) of the alignment mark AM can be easily detected.

On the other hand, the signal of secondary electrons is small in the thin metal layer 40x2 as illustrated in FIG. 9B, and the edge of the alignment mark AM cannot be easily detected. More specifically, even if scanning is performed in the vicinity of the alignment mark AM, electrons instantaneously pass through the metal layer 40x2 (light shielding film) and the quantity (density) of the secondary electrons generated is small, resulting in difficulty of securement of the signal strength.

When the detection accuracy of the alignment mark AM decreases as described above, the accuracy of overlapping the first layer and the second layer decreases.

In contrast, in the first embodiment, making the thicknesses of the metal layers 40 in the main pattern region A1 and the alignment mark region A2 different from each other enables both improvement in pattern accuracy in the main pattern MP and securement of the detection accuracy of the alignment mark AM.

Modification Example of First Embodiment

Hereinafter, a modification example of the first embodiment will be described. Here, the mask substrate W1 is formed in the following procedures (1) to (3).

Figure 10A:
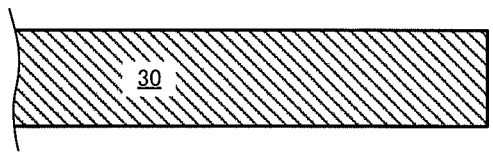
FIG. 10A to FIG. 10D are views illustrating manufacturing steps of the phase shift mask 20 according to a modification example of the first embodiment.
Figure 10B:
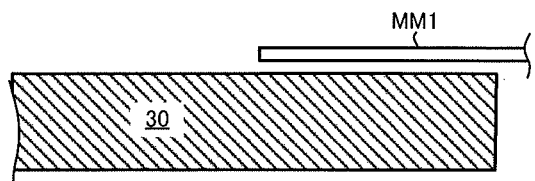
Figure 10C:
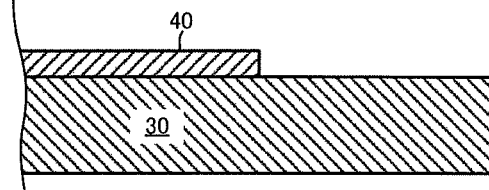

(1) Formation of the metal layer 40 in the main pattern region A1 (see FIG. 10A to FIG. 10C)

The mask MM1 is placed in the alignment mark region A2 and the metal layer 40 is formed by sputtering or the like. For the mask MM1, for example, a mechanical mask of a metal plate or the like can be used. As a result, the metal layer 40 is formed only in the main pattern region A1 of the substrate 30.

Figure 10D:
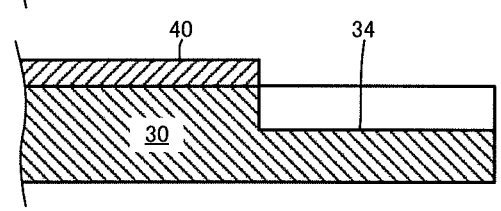

(2) Etching of the substrate 30 (See FIG. 10D)

The substrate 30 is etched using the metal layer 40 as a mask. As a result, the substrate 30 in the alignment mark region A2 is etched, whereby the recessed portion 34 is formed.

Figure 11A:
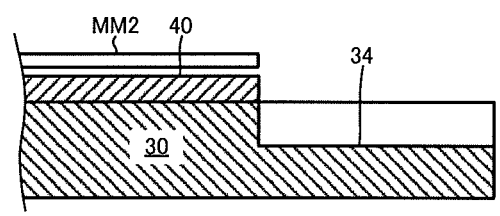
FIG. 11A to FIG. 11C are views illustrating manufacturing steps of the phase shift mask 20 according to the modification example of the first embodiment.
Figure 11B:
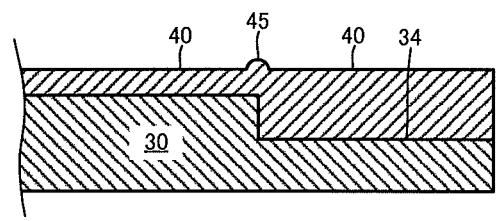
Figure 11C:
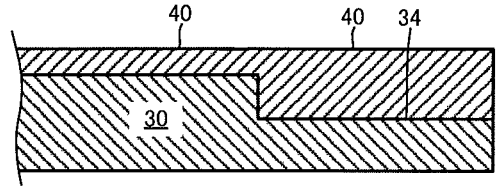

(3) Formation of the metal layer 40 in the alignment mark region A2 (see FIG. 11A to FIG. 11C)

The mask MM2 is placed in the main pattern region A1 and the metal layer 40 is formed by the sputtering or the like. For the mask MM2, for example, a mechanical mask of a metal plate or the like can be used. Here, the metal layers 40 are formed to overlap each other near the boundary between the main pattern region A1 and the alignment mark region A2 to cause the projecting portion 45.

The surfaces of the metal layers 40 are planarized using the chemical mechanical polishing or the like as necessary. Here, the aforementioned projecting portion 45 is removed by planarization.

Thereafter, the resist layer 50 is formed on the metal layers 40, whereby the mask substrate W1 is created (see FIG. 5A).

In the above manner, the mask substrate W1 can be created. Thereafter, the phase shift mask 20 can be created in the same procedures as those in the first embodiment.

Second Embodiment

Hereinafter, a second embodiment will be described.

A. Phase Shift Mask

Hereinafter, a phase shift mask according to this embodiment will be described.

Figure 12:
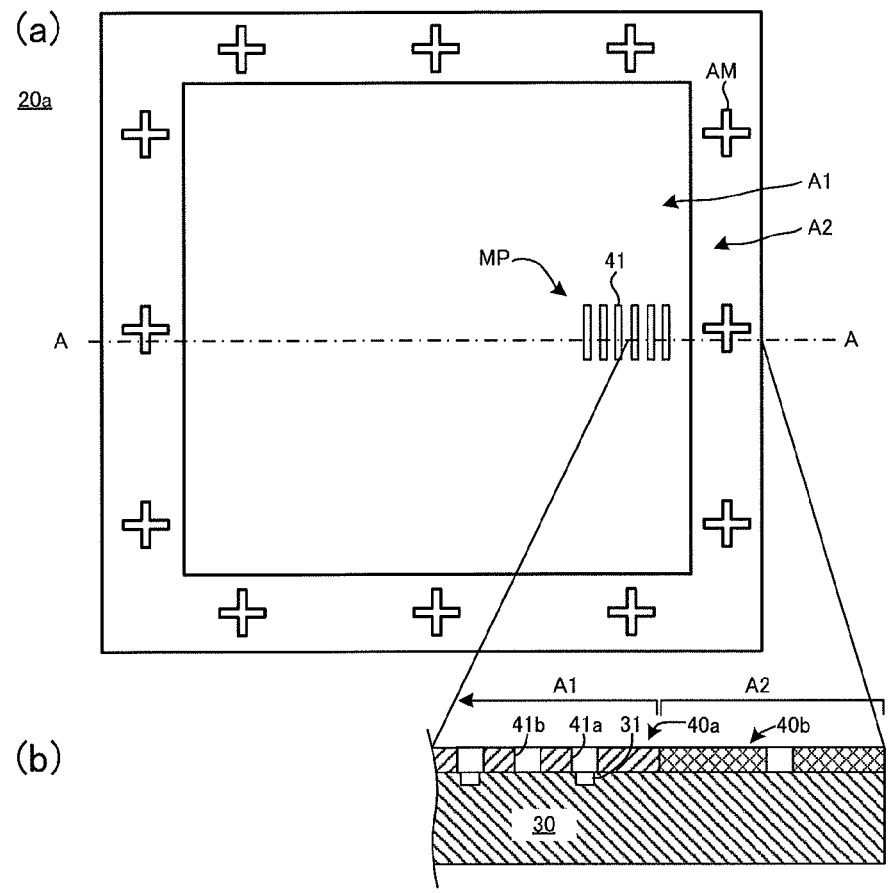
FIG. 12 is a plan view and a cross-sectional view illustrating a phase shift mask 20a according to a second embodiment.

FIG. 12 is a top view and a cross-sectional view illustrating a phase shift mask 20a according to the second embodiment. (a) and (b) in FIG. 12 correspond to the top view and the cross-sectional view respectively. The cross-sectional view illustrates an enlarged state of the phase shift mask 20a cut along a line A-A in the top view.

In this embodiment, a secondary electron emitting rate $\eta 2$ in a metal layer 40b in an alignment mark region A2 is higher than a secondary electron emitting rate $\eta 1$ in a metal layer 40a in a main pattern region A1. As a result of this, it is possible to secure the quantity (density) of secondary electrons when the alignment mark region A2 is irradiated with electrons and to obtain a clear secondary electron image. In other words, even when the thickness of the metal layer 40a in the main pattern region A1 is small and the quantity (density) of the secondary electrons generated when the main pattern region A1 is irradiated with electrons is low and therefore it is difficult to obtain a clear secondary electron image, it is easy to obtain a clear secondary electron image in the alignment mark region A2.

It is assumed that the thicknesses of the metal layers 40a, 40b are, for example, 5 nm to 20 nm (preferably, 5 nm to 10 nm).

Figure 13:
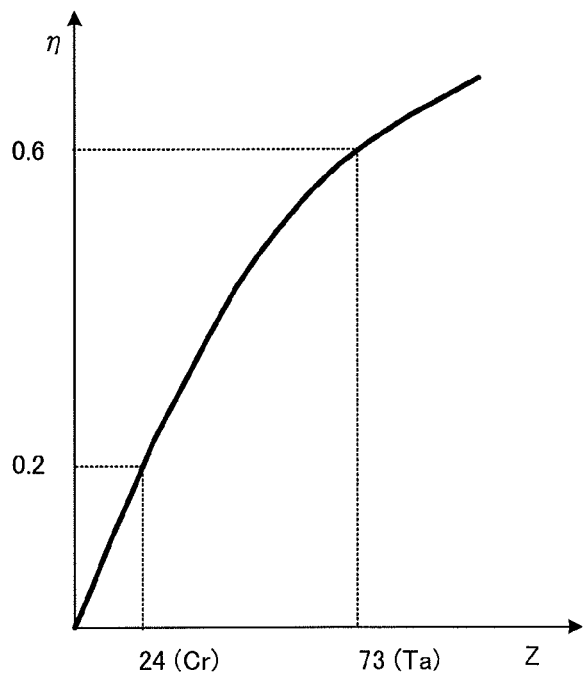
FIG. 13 is a graph illustrating a relationship between an atomic number Z and a secondary electron emitting rate $\eta$.
Figure 14A:
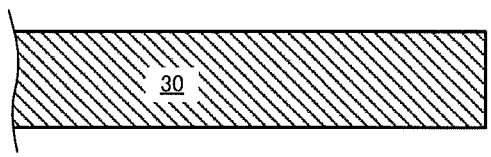
FIG. 14A to FIG. 14F are views illustrating manufacturing steps of the phase shift mask 20a according to the second embodiment.
Figure 14B:
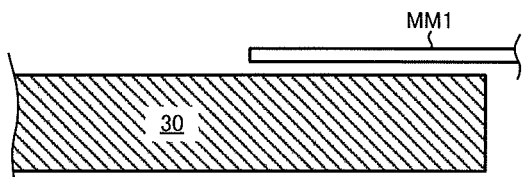
Figure 14C:
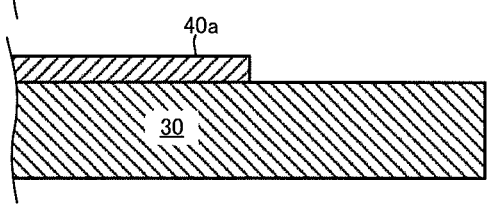
Figure 14D:
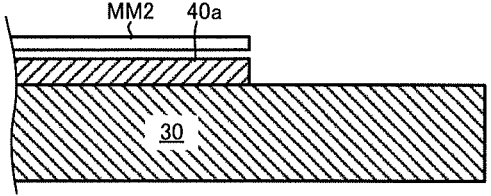
Figure 14E:
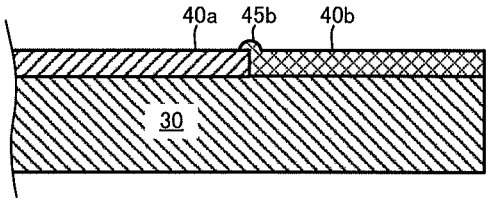
Figure 14F:
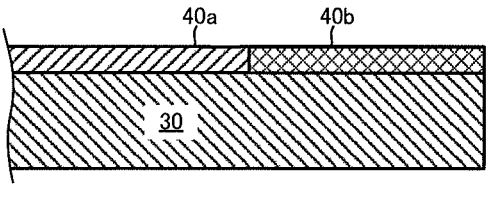

As illustrated in FIG. 13, among metal elements, the one having a larger atomic number Z also has a higher secondary electron emitting rate η. For example, by constituting the metal layer 40a in the main pattern region A1, for example, of Cr and constituting the metal layer 40b in the alignment mark region A2, for example, of Ta, the secondary electron emitting rates η in the main pattern region A1 and the alignment mark region A2 can be made different from each other.

Note that examples of the combination of the metal layers 40a and 40b include a combination of Cr and W and a combination of Cr and Pt in addition to a combination of Cr and Ta.

Such manufacturing steps of the substrate are illustrated in FIG. 14. Since the reflected electron emitting rate of the light shielding film in the alignment mark part is high, a reflected electron signal becomes large.

B. Manufacture of the Phase Shift Mask 20a

Hereinafter, a manufacturing method of the phase shift mask 20a will be described. Here, the phase shift mask 20a is manufactured in the following procedures (1) to (4).

(1) Creation of a mask substrate Wa1

The mask substrate Wa1 is created by the following procedures a to c.

a. Formation of the metal layer 40a in the main pattern region A1 (see FIG. 14A to FIG. 14C)

A mask MM1 is placed in the alignment mark region A2 and the metal layer 40a is formed by sputtering or the like. For the mask MM1, for example, a mechanical mask of a metal plate or the like can be used.

b. Formation of the metal layer 40b in the alignment mark region A2 (see FIG. 14D, FIG. 14E)

A mask MM2 is placed in the main pattern region A1 and the metal layer 40b is formed by the sputtering or the like. For the mask MM2, for example, a mechanical mask of a metal plate or the like can be used. Here, the metal layers 40a, 40b are formed to overlap each other near the boundary between the main pattern region A1 and the alignment mark region A2 to cause a projecting portion 45b.

c. Planarization of the Metal layers 40a, 40b (see FIG. 14E to FIG. 14F)

The surfaces of the metal layers 40a, 40b are planarized using the chemical mechanical polishing or the like as necessary. Here, the aforementioned projecting portion 45b is removed by planarization.

Note that also when there is a film thickness difference between the metal layers 40a and 40b, it is preferable to uniform the film thicknesses using the chemical mechanical polishing or the like.

Figure 15A:
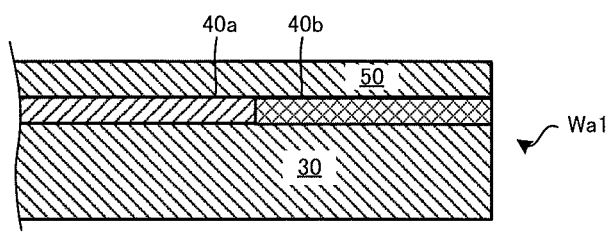
FIG. 15A to FIG. 15D are views illustrating manufacturing steps of the phase shift mask 20a according to the second embodiment.
Figure 15B:
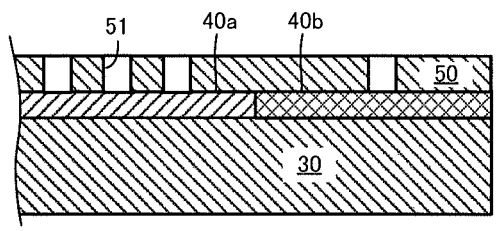
Figure 15C:
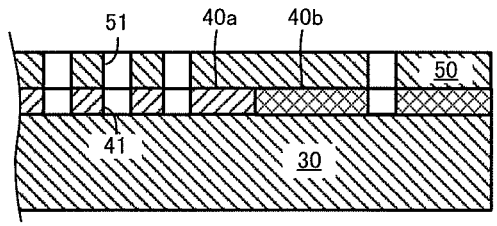
Figure 15D:
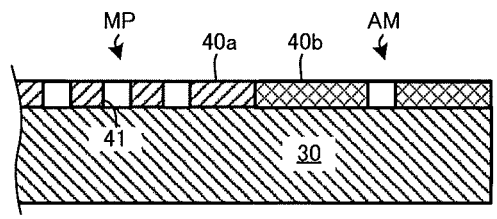

Thereafter, the resist layer 50 is formed on the metal layers 40a, 40b, whereby the mask substrate Wa1 is created (see FIG. 15A).

The mask substrate Wa1 is created as described above.

Here, the metal layers 40a, 40b are formed in the main pattern region A1 and the alignment mark region A2 in this order, but this order may be inverted.

Further, the metal layers 40 are formed to overlap each other at the boundary between the main pattern region A1 and the alignment mark region A2, but the metal layers 40a, 40b may be thin or no metal layers 40a, 40b may be provided at the boundary.

(2) Patterning of the metal layers 40a, 40b (see FIG. 15A to FIG. 15D)

Figure 16A:
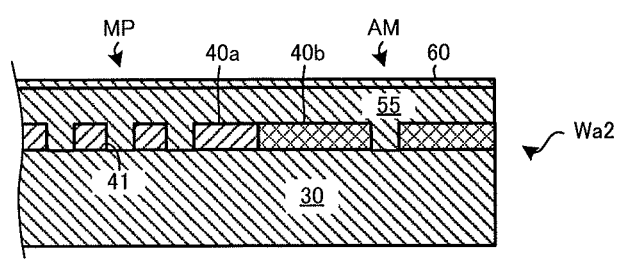
FIG. 16A and FIG. 16D are views illustrating manufacturing steps of the phase shift mask 20a according to the second embodiment.

(3) Alignment and drawing (see FIG. 16A)

Figure 16B:
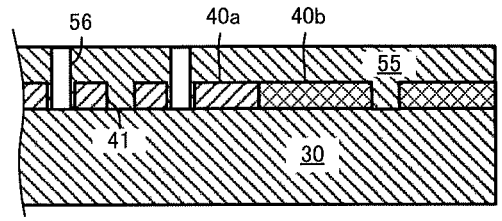
Figure 16C:
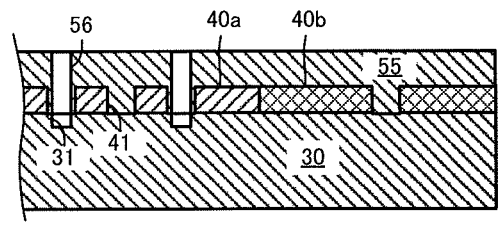
Figure 16D:
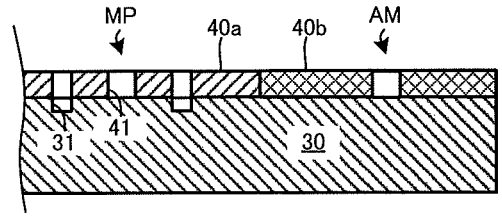

(4) Patterning of a substrate 30 (see FIG. 16B to FIG. 16D)

These procedures of (2) to (4) are the same as the procedures (2) to (4) in the first embodiment and therefore detailed description thereof will be omitted.

In the second embodiment, since the materials of the metal layers 40 in the main pattern region A1 and the alignment mark region A2 are different, it becomes easy to improve the pattern accuracy in the main pattern MP and secure the detection accuracy of the alignment mark AM.

Modification Example of Second Embodiment

In the second embodiment, the film thicknesses of the metal layers 40a, 40b in the main pattern region A1 and the alignment mark region A2 are the same. In contrast, the film thicknesses of the metal layers 40a, 40b in the main pattern region A1 and the alignment mark region A2 may be made different from each other.

Concretely, the constituent materials of the metal layers 40a, 40b in the main pattern region A1 and the alignment mark region A2 are made different from each other when creating the mask substrate Wa1 in the procedures illustrated in the first embodiment or its modification example.

In this case, a metal layer 40a that is thin and has a low secondary electron emitting rate η is arranged in the main pattern region A1, and a metal layer 40b that is thick and has a high secondary electron emitting rate η is arranged in the alignment mark region A2. For example, the thickness of the metal layer 40a is set to 5 nm to 20 nm (preferably 5 nm to 10 nm), and the thickness of the metal layer 40b is set to 30 nm to 60 nm (preferably 30 nm to 50 nm).

As a result, it becomes possible to more surely detect the alignment mark AM.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A mask manufacturing method comprising:
   forming a metal layer on a substrate, the metal layer having a first region and a second region, the first region being configured to emit secondary electrons by irradiation with electrons, the second region being configured to emit secondary electrons higher in density than the first region, by the irradiation with electrons;

patterning the metal layer to form a main pattern in the first region and an alignment mark in the second region;

forming a resist layer on the patterned metal layer; and aligning the substrate using a secondary electron image of the alignment mark.

2. The mask manufacturing method according to claim 1, wherein a thickness of the metal layer in the second region is larger than a thickness of the metal layer in the first region.

3. The mask manufacturing method according to claim 2, wherein the thickness of the metal layer in the first region is 5 nm or more and 20 nm or less, and wherein the thickness of the metal layer in the second region is 40 nm or more and 70 nm or less.

4. The mask manufacturing method according to claim 2, wherein the metal layer includes Cr, Ta, MoSi or Al.

5. The mask manufacturing method according to claim 2, wherein the patterning the metal layer comprises etching the metal layer in the first region at a first rate while etching the metal layer in the second region at a second rate higher than the first rate.

6. The mask manufacturing method according to claim 5, wherein the metal layer in the first region contains an oxide, and wherein the metal layer in the second region is substantially free of oxide.

7. The mask manufacturing method according to claim 1, wherein the metal layer in the first region includes a first metal material, and wherein the metal layer in the second region includes a second metal material higher in secondary electron emitting rate than the first metal material.

8. The mask manufacturing method according to claim 7, wherein the first metal material includes Cr, and the second metal material includes Ta, W or Pt.

9. The mask manufacturing method according to claim 7, wherein a thickness of the metal layer is 5 nm or more and 20 nm or less.

10. The mask manufacturing method according to claim 7, wherein a thickness of the metal layer in the second region is larger than a thickness of the metal layer in the first region.

11. The mask manufacturing method according to claim 10, wherein the thickness of the metal layer in the first region is 5 nm or more and 20 nm or less, and wherein the thickness of the metal layer in the second region is 30 nm or more and 60 nm or less.

12. The mask manufacturing method according to claim 1, wherein a height of an upper surface of the metal layer in the first region and a height of an upper surface of the metal layer in the second region are almost equal to each other.

13. The mask manufacturing method according to claim 1, further comprising:

performing drawing with an electron beam on the resist layer on the aligned substrate; patterning the resist layer having subjected to the drawing;

etching the substrate using the patterned resist layer as a mask; and removing the patterned resist layer.

14. A mask substrate comprising:

a substrate;

a metal layer on the substrate, having a first region and a second region, the first region being configured to emit secondary electrons by irradiation with electrons, the second region being configured to emit secondary electrons higher in density than the first region, by the irradiation with electrons, and patterned to have a main pattern and an alignment mark in the first region and the second region respectively; and a resist layer arranged on the metal layer, wherein a thickness of the metal layer in the second region is larger than a thickness of the metal layer in the first region.

15. The mask substrate according to claim 14, wherein the thickness of the metal layer in the first region is 5 nm or more and 20 nm or less, and wherein the thickness of the metal layer in the second region is 40 nm or more and 70 nm or less.

16. The mask substrate according to claim 14, wherein the metal layer includes Cr, Ta, MoSi or Al.

17. The mask substrate according to claim 14, wherein the metal layer in the first region contains an oxide, and wherein the metal layer in the second region is substantially free of oxide.

18. The mask substrate according to claim 14, wherein the metal layer in the first region includes a first metal material, and wherein the metal layer in the second region includes a second metal material higher in secondary electron emitting rate than the first metal material.

19. The mask substrate according to claim 14, wherein the first metal material is Cr, and the second metal material is any of Ta, W, Pt.

20. A charged beam drawing method comprising:

using a secondary electron image of the alignment mark of the mask substrate according to claim 14 to aligning the mask substrate; and drawing a pattern on the aligned mask substrate.

* * * * *